United States Patent [19]
von Alpen et al.

[11] Patent Number: 4,504,120
[45] Date of Patent: Mar. 12, 1985

[54] CERAMIC SUBSTRATE SUPPORT FOR ELECTRONIC COMPONENTS AND INTEGRATED ELECTRONIC CIRCUITS

[75] Inventors: Ulrich von Alpen, Schlossborn; Stefan Schindler; Heinrich Schelter, both of Selb, all of Fed. Rep. of Germany

[73] Assignee: Varta Batterie Aktiengesellschaft, Hannover, Fed. Rep. of Germany

[21] Appl. No.: 462,470

[22] Filed: Jan. 31, 1983

[30] Foreign Application Priority Data

Feb. 27, 1983 [DE] Fed. Rep. of Germany ....... 3207131

[51] Int. Cl.$^3$ .................... G02F 1/01; H01M 10/38
[52] U.S. Cl. ................................ 350/357; 429/191
[58] Field of Search .............. 429/191, 162, 124; 29/577 C; 350/357, 331 R; 340/333, 781, 782; 361/331

[56] References Cited

U.S. PATENT DOCUMENTS 4,106,862  8/1978  Bayard ........................ 350/357

FOREIGN PATENT DOCUMENTS 3016524  11/1981  Fed. Rep. of Germany ...... 429/191

*Primary Examiner*—Donald L. Walton
*Attorney, Agent, or Firm*—Weiser & Stapler

[57] ABSTRACT

By use of new ion conducting but non-electron conducting mixed crystal compounds of the type sodium zirconium phosphatosilicate as the ceramic board material for electronic circuitry it is possible to provide full integration of electronic, electro-chemical and optical components, because the boards simultaneously constitute the solid electrolyte for the miniaturized batteries serving as energy source, and for an electrochromic display system. An illustrative practical embodiment involves housing within a ceramic multi-layer structure a battery with positive electrode and negative electrode for a quartz driving circuit and an electrochromic (ECD) display controlled by an microprocessor. For the flow of current through the ECD there is used a secondary element formed of a $WO_3$ electrode and a Na-tungstenate electrode as the counter electrode, the $WO_3$ segments assuming a blue color due to diffusion of $Na^+$ ions.

15 Claims, 1 Drawing Figure

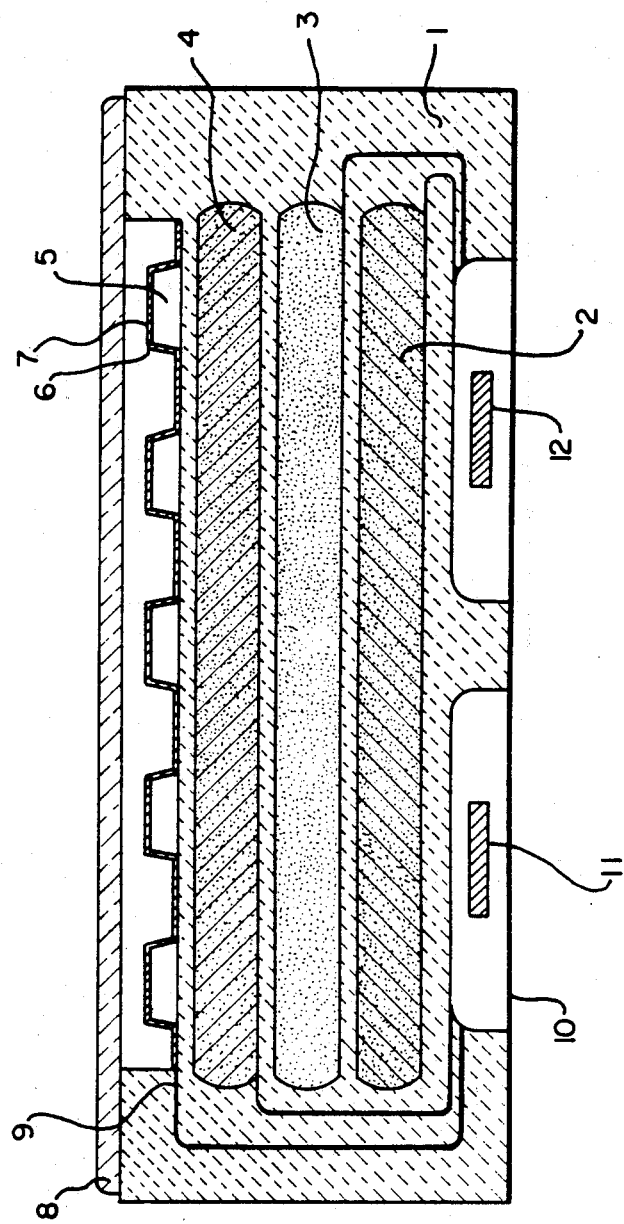

CERAMIC SUBSTRATE SUPPORT FOR ELECTRONIC COMPONENTS AND INTEGRATED ELECTRONIC CIRCUITS

The invention relates to a ceramic substrate for supporting electronic components and electronic integrated circuits.

The trend in the development of electronic components is to concentrate more and more electronic functions within a smaller and smaller space through large scale integration. This development involves not only passive components such as storage elements but also active elements such as optocouplers. The inter-connection of the individual electronic components into circuits takes place in the current state of the art on so-called circuit boards, which are plastic plates with the conductors of the circuits printed on, etched in, or photochemically produced. The degree of integration upon these boards has also progressively increased as a result of development. However, it encounters a limitation which is determined by the composition of the support material, and depends upon the conductivity, thermal loading capacity, and chemical stability of that material.

A special problem in large scale integration is the uncontrolled heat loading which arises through the accumulation of electrical components, due to the fact that the thermal conductivity of plastics is too low to insure controlled heat dissipation. Moreover, the softening point of the plastic boards is so low that the electrical circuit architecture is damaged.

From German patent publication (Offenlegungsschrift) No. 2,727,364, there is known a method of manufacturing a tape-like ceramic substrate based upon aluminum oxide through extrusion and firing of the segmented shaped pieces, which take the form of ceramic boards of high thermal load capacity. The unfired greenlings are susceptible of plastification, so that boards of desired structure and size can be rolled and fired. The surface quality of the resulting substrate permits the application of conductive paths both for thick film and thin film circuits. In accordance with European patent application No. 0036435A1 it is even possible, using suitable techniques, to produce ceramic multilayer housings for receiving electronic circuits which permit an even higher degree of integration.

In parallel with the progress of micro-electronics there also took place, albeit separately, the miniaturization of the batteries needed to operate the electronics, in the form of button cells, and the progressive development of the displays used in electronic devices which are based either upon current intensive but highly contrasty LED systems or upon poorly contrasty but high impedance LCD systems.

Accordingly, it is an object of the present invention to provide a ceramic substrate for the application not only of electronic and optic, but also electrochemical components, and which permits integrated connection and operation of these elements.

This object and others which will appear are accomplished in accordance with the invention by using as the substrate an ion conducting solid electrolyte having a room temperature conductivity which is at least $\sigma = 10^{-3} \Omega^{-1} cm^{-1}$.

A particularly desirable solid electrolyte material consists of mixed crystals of the general composition.

$Na_{1+x}Zr_{2-1/3x+y}Si_xP_{3-x}O_{12-2/3x+2y}$ with variable parameters $0.01 < x < 3$ and $0 < y < 0.5$, or $Na_{1-} + axZr_{2+2/3x-ax}Si_xP_{3-x}O_{12-2/3x}$ with a=a constant having a value between 0.8 and 0.9 and the variable parameter $1.8 < x < 2.3$.

The first mentioned series of mixed crystals, which is preferred because of its especially good ion conductivity at room temperature, is described in prior German patent application No. P30 32 894 corresponding to U.S. patent application Ser. No. 287,465, filed Aug. 28, 1981 now U.S. Pat. No. 4,374,920. The second series of mixed crystals is described in prior German patent application No. P31 23 099 corresponding to U.S. application Ser. No. 369,364, filed Apr. 19, 1982 now U.S. Pat. No. 4,394,280.

There are several kinds of reasons why the solid electrolytes embodying the invention are particularly suitable as support material: because of their very low electron conductivity they are practically insulators and therefore are useable substrate supports for the electronic components such as microprocessors and/or quartz driving circuits. For these purposes they are even preferable to the previously used α-Korund according to German industrial standard DIN No. 51068, because the material embodying the invention can be obtained at a low sinter temperature of about 1250° C., compared to 1650° to 1750° C. for α-Korund but, on the other hand, has higher resistance to temperature change. The proof of this comes from comparison of a material from the above mentioned German patent application P30 32 894 having the preferred composition $Na_{x.94}Zr_{1.40}Si_{2.2}P_{0.8}O_{10.53}$ and α-Korund. For comparable external dimensions of the test body, a composition embodying the invention broke into separate pieces only after six cycles of heating and cooling, whereas the α-Korund, due to its low resistance to temperature change, broke already after the first cycle.

The second function of the ceramic substrate embodying the invention is that, due to its ion conductivity, it can assume directly the role of the electrolyte for solid batteries of the Na type. On the other hand, due to its above-mentioned electronic insulating properties, it also meets the requirements of a support for layered circuits. Thus there becomes possible the integration of electronic and electrochemical structural elements on a common support substrate. Simultaneously, by use of suitable coating techniques such as evaporative deposition, silk screening, etc., continuous automated production of individual substrates from the plastified foil becomes possible.

A battery, for example for maintaining stored information or as electrical current source, can be intergrated in such a manner that the plastified ceramic substrate is either suitably preformed at the intended location of the current source, e.g. by the introduction of protruding shapes, or by adding heat dissipatable materials, such as starch compounds, to produce a particularly porous configuration of the ceramic substrate. The active materials such as sodium for the anode side, and compounds such as $AlCl_3$, $BiCl_3$, or $WCl_6$ for the cathode side, can be introduced into these shaped locations in the molten state. For materials with melting points above 200° C., or with high vapor pressures, it is desirable to press these materials onto the substrate support. Because Na-based electrochemical elements, due to the high reactivity of sodium or their compounds with water or oxygen, must be operated in a sealed protective gas, anode and cathode components must be suitably encapsulated upon the substrate support. The ceramic substrate embodying the invention provides in desirable fashion the possibility of not only distributing the electronic conductive paths through a multi-layer structure over several surfaces, but also to provide hollow spaces which, after firing of the substrate, can be filled with the active material in the molten state. After the active masses have solidified, the lead-through holes can be closed, for example with glass solder, whereby the current sources are also integrated into the multi-layer structure. The metallic conductors are attached to the structure even before the firing process.

In a particularly desirable embodiment of the invention, the ceramic substrate also serves as solid electrolyte for an electrochromic (ECD) display, and thereby completes the integratability of electronic components with optical and electrochemical components within a ceramic multi-layer housing. In so doing, the white color of the solid electrolytes embodying the invention is particularly desirable because, if a solid ECD with $WO_3$, for example, is used, this stands out in strong contrast from a white background due to the blue coloring resulting from electrochemical processes (diffusion of $Na^+$ ions). The current source for the ECD can be attached separately, e.g. in the same multi-layer housing below the ECD. This would yield a small thickness for a surface which is determined only by the display screen. This display, in addition to being conspicuous, also has the desirable property of being capable of information storage.

For further details reference is made to the description which follows in light of the accompanying single FIGURE of drawing which shows an illustrative preferred embodiment of the invention.

Referring to this drawing, the multi-layer housing 1 produceable by modern methods of ceramic technology from a sodium zirconium phosphatosilicate solid electrolyte embodying the invention contains, in the intermediate spaces defined by the layers, counting from the bottom, a positive battery electrode 2 and a negative Na electrode 3, a sodium tungstenate electrode 4, and on the topmost layer as its counter electrode a $WO_3$ coating 5 which is vapor deposited in segments and covers the white surface layer only partially. The latter electrodes form a complete electrochromic display together with a $SiO_2$ insulating layer 6 and a transparent take-away conductor 7 of Sn- doped $In_2O_3$ and the glass cover 8. Conductive paths 9 of Au, Pt or other noble metals connect all of these electrochemical components with an electronic control circuit 10 positioned in the bottom of the housing, which here consists, for example, of a microprocessor 11 and a quartz driver stage 12.

It is even possible to unite the functions of the two positive electrode functions 2 and 4 into a single positive electrode, e.g. the sodium electrode 4, so that the energy supply of the electronic components and ECD is provided by a common electrochemical current source. In this way, one of the pockets for receiving active positive electrode material can be eliminated.

The invention thus makes it possible first to unite in one and the same ceramic substrate support electronic, optical and electrochemical functions. Assuming a programmable processor logic, this concept enables a multiplicity of apparatus functions such as time keeping, multi-meter function, etc., to be performed by a single structure. The possibility of automating the handling of the plastified ceramic tapes points the way toward economical manufacture.

We claim:

1. A ceramic housing for electronic components and integrated electronic circuits, said housing consisting of a multi-layered structure of an ion-conducting solid electrolyte material having a minimum conductivity at room temperature of $\sigma = 10^{-3} \Omega^{-1} cm^{-1}$, whereby said housing is suitable as the electrolyte for a solid battery and as insulation for electronic components.

2. The ceramic substrate of claim 1, wherein the solid electrolyte is a mixed crystal of the general composition

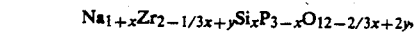
$Na_{1+x}Zr_{2-1/3x+y}Si_xP_{3-x}O_{12-2/3x+2y}$, where
$0.01 < x < 3$ and $0 < y < 0.5$, or of the general composition $Na_{1+ax}Zr_{2+2/3x-ax}Si_xP_{3-x}O_{12-2/3x}$
where
a = a constant between 0.8 and 0.9, and $1.8 < x < 2.3$.

3. The ceramic substrate of claim 1 characterized in that the solid electrolyte is simultaneously the solid electrolyte for an electrochromic display.

4. The housing of claim 1 including circuit means integrated in said structure so as to provide operative electrical contact between the components placed thereon.

5. The housing of claim 1 which is an electrolyte for an electrochromic display.

6. An electrochromic display cell comprising:
a multi-layered ceramic support structure of an ion-conducting solid electrolyte material having a minimum conductivity at room temperature of $\sigma = 10^{-3} \Omega^{-1} cm^{-1}$;
a positive battery electrode positioned upon a first layer of said support structure;
a sodium electrode positioned upon a second layer of said support structure;
a sodium tungstenate electrode positioned upon a third layer of said support structure;
an electrochromic $WO_3$ element positioned upon a fourth layer of said support structure, and
circuit means for operatively connecting the components.

7. The display cell of claim 6, wherein the solid electrolyte is a mixed crystal of the general composition

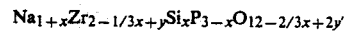
$Na_{1+x}Zr_{2-1/3x+y}Si_xP_{3-x}O_{12-2/3x+2y}$ where
$0.01 < x < 3$ and $0 < y < 0.5$, or of the general composition

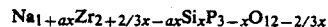
$Na_{1+ax}Zr_{2+2/3x-ax}Si_xP_{3-x}O_{12-2/3x}$ where a = a constant between 0.8 and 0.9, and $1.8 < x < 2.3$.

8. The display cell of claim 6 wherein the cathode material is selected from the group consisting of $AlCl_3$, $BiCl_3$ and $WCl_3$.

9. The display cell of claim 8 wherein said cathode material is placed into said support structure in molten form.

10. The display cell of claim 6 wherein said circuit means is integrated in said support structure.

11. The display cell of claim 6 wherein said positive electrode and said sodium electrode are encapsulated upon said support.

12. An electrochromic display cell comprising:
a multi-layered ceramic support structure of sodium zirconium phosphatosilicate material having a minimum conductivity at room temperature of $\sigma = 10^{-3} \Omega^{-1} cm^{-1}$;

a positive battery electrode positioned upon a first layer of said support structure;

a sodium electrode positioned upon a second layer of said support structure, a sodium tungstenate electrode positioned upon a third layer of said support structure, a $WO_3$ coating on a fourth layer of said support structure, said $WO_3$ coating being a counter electrode for said sodium tungstenate electrode so as to form an elctrochromic display, and circuit means for operatively connecting said components.

13. The display cell of claim 12 including an electronic control circuit positioned in said support structure operatively connected with all of said electrodes.

14. The display cell of claim 13 wherein said control circuit is a microprocessor and quartz driver means.

15. The display cell of claim 12 wherein said circuit means is integrated into said support structure.

* * * * *